US 11,026,057 B2

(12) United States Patent
Song et al.

(10) Patent No.: US 11,026,057 B2
(45) Date of Patent: Jun. 1, 2021

(54) MULTICAST MESSAGING WITHIN A WIRELESS COMMUNICATION SYSTEM

(71) Applicant: QUALCOMM Incorporated, San Diego, CA (US)

(72) Inventors: Bongyong Song, San Diego, CA (US); Harleen Gill, Los Altos, CA (US); Arulmozhi Ananthanarayanan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/292,597

(22) Filed: Oct. 13, 2016

(65) Prior Publication Data
US 2017/0034671 A1 Feb. 2, 2017
US 2018/0367956 A9 Dec. 20, 2018

Related U.S. Application Data

(62) Division of application No. 14/026,128, filed on Sep. 13, 2013, now Pat. No. 9,479,350, which is a division
(Continued)

(51) Int. Cl.
*H04W 4/06* (2009.01)
*H04W 76/45* (2018.01)
(Continued)

(52) U.S. Cl.
CPC ............... *H04W 4/06* (2013.01); *F03G 5/06* (2013.01); *H01L 37/00* (2013.01); *H01L 41/082* (2013.01);
(Continued)

(58) Field of Classification Search
CPC ......... H04W 4/06; H04W 4/10; H04W 52/50; H04W 68/02; H04W 72/005; H04W 76/45; H04W 76/40; H04W 68/025
(Continued)

(56) References Cited

U.S. PATENT DOCUMENTS 5,600,635 A 2/1997 Hamaki et al.
6,055,560 A 4/2000 Mills et al.
(Continued)

FOREIGN PATENT DOCUMENTS

CN 1565104 A 1/2005
JP 2001359161 A 12/2001
(Continued)

OTHER PUBLICATIONS

3GPP2 "CDMA2000 High Rate Broadcase-Multicast Packet Data Air Interface Specification," Feb. 14, 2006, version 1.0 C.S0054-A.
(Continued)

*Primary Examiner* — Harun Chowdhury
(74) *Attorney, Agent, or Firm* — Muncy, Geissler, Olds & Lowe, P.C.

(57) ABSTRACT

Methods and systems for sending multicast messages are disclosed. A multicast message is received to be transmitted to a plurality of access terminals at a radio access network (RAN), the received multicast message having a first format. The first format may correspond to a conventional multicast message format. The RAN determines whether the received multicast message requires special handling. If the RAN determines the received multicast message requires special handling, the radio access network converts the received multicast message from the first format into a second format. The RAN transmits the converted multicast message with the second format (e.g., a data over signaling (DOS) message) on a control channel to at least one of the plurality of access terminals. The access terminals receiving the converted multicast message interpret the message as a multicast message.

35 Claims, 6 Drawing Sheets

Related U.S. Application Data of application No. 12/212,462, filed on Sep. 17, 2008, now Pat. No. 8,570,911.

(60) Provisional application No. 60/974,833, filed on Sep. 24, 2007.

(51) Int. Cl.

| | | |
|---|---|---|
| H04L 12/18 | (2006.01) | |
| H04W 72/00 | (2009.01) | |
| H01L 37/00 | (2006.01) | |
| H01L 41/08 | (2006.01) | |
| H02N 2/18 | (2006.01) | |
| H04W 4/10 | (2009.01) | |
| H04W 76/40 | (2018.01) | |
| F03G 5/06 | (2006.01) | |

(52) U.S. Cl.
CPC .............. *H02N 2/18* (2013.01); *H02N 2/183* (2013.01); *H04L 12/189* (2013.01); *H04L 12/1881* (2013.01); *H04W 4/10* (2013.01); *H04W 72/005* (2013.01); *H04W 76/40* (2018.02); *H04W 76/45* (2018.02)

(58) Field of Classification Search
USPC ........ 370/312, 390, 392; 455/418, 419, 518, 455/519
See application file for complete search history.

(56) References Cited

U.S. PATENT DOCUMENTS

| | | |
|---|---|---|
| 6,442,390 B1 | 8/2002 | Sano |
| 6,804,528 B1 | 10/2004 | Laroia et al. |
| 6,839,767 B1 | 1/2005 | Davies et al. |
| 6,901,058 B2 | 5/2005 | Lalwaney |
| 6,977,928 B1 | 12/2005 | Bass et al. |
| 7,092,381 B2 | 8/2006 | Carlsson et al. |
| 7,664,517 B2 | 2/2010 | Ananthanarayanan et al. |
| 7,945,234 B2 | 5/2011 | Lee et al. |
| 8,570,911 B2 | 10/2013 | Song et al. |
| 9,344,290 B2 | 5/2016 | Song |
| 2001/0026549 A1 | 10/2001 | Hameleers et al. |
| 2002/0003787 A1 | 1/2002 | Hayama et al. |
| 2002/0085537 A1 | 7/2002 | Carlsson et al. |
| 2002/0152321 A1 | 10/2002 | Le et al. |
| 2003/0134622 A1* | 7/2003 | Hsu ................. H04W 76/40 455/414.1 |
| 2003/0235181 A1 | 12/2003 | Semper et al. |
| 2004/0037237 A1 | 2/2004 | Lalwaney |
| 2004/0132448 A1 | 7/2004 | Torres et al. |
| 2005/0288049 A1* | 12/2005 | Gill ................. H04W 76/45 455/518 |
| 2006/0039482 A1 | 2/2006 | Cho |
| 2006/0046762 A1* | 3/2006 | Yoon ................. H04W 68/02 455/519 |
| 2006/0053452 A1 | 3/2006 | Lee et al. |
| 2006/0092863 A1 | 5/2006 | Schmidt et al. |
| 2006/0109846 A1 | 5/2006 | Lioy et al. |
| 2006/0223510 A1 | 10/2006 | Takeda et al. |
| 2007/0049314 A1* | 3/2007 | Balachandran ......... H04W 4/10 455/518 |
| 2007/0130362 A1 | 6/2007 | Oommen et al. |
| 2007/0213081 A1 | 9/2007 | Zhang |
| 2007/0218928 A1 | 9/2007 | Kuo |
| 2007/0233889 A1 | 10/2007 | Guo et al. |
| 2007/0280138 A1 | 12/2007 | Stern |
| 2008/0232293 A1* | 9/2008 | Mooney .............. H04W 68/025 370/312 |
| 2009/0201844 A1* | 8/2009 | Bhatti .................. H04W 4/06 370/312 |
| 2014/0016535 A1 | 1/2014 | Song et al. |

FOREIGN PATENT DOCUMENTS

| | | |
|---|---|---|
| JP | 2002095065 A | 3/2002 |
| JP | 2002204204 A | 7/2002 |
| WO | WO-9923844 A2 | 5/1999 |
| WO | WO-03060452 A2 | 7/2003 |
| WO | WO-2005041459 A2 | 5/2005 |
| WO | WO-2006002218 A1 | 1/2006 |
| WO | WO-2006089197 A1 | 8/2006 |
| WO | WO-2007011271 A1 | 1/2007 |

OTHER PUBLICATIONS

European Search Report—EP10159408—Munich—dated May 12, 2010.
International Search Report—PCT/US08/077016, International Search Authority—European Patent Office—dated Apr. 28, 2009.
Written Opinion—PCT/US08/077016, International Search Authority—European Patent Office—dated Apr. 28, 2009.

* cited by examiner

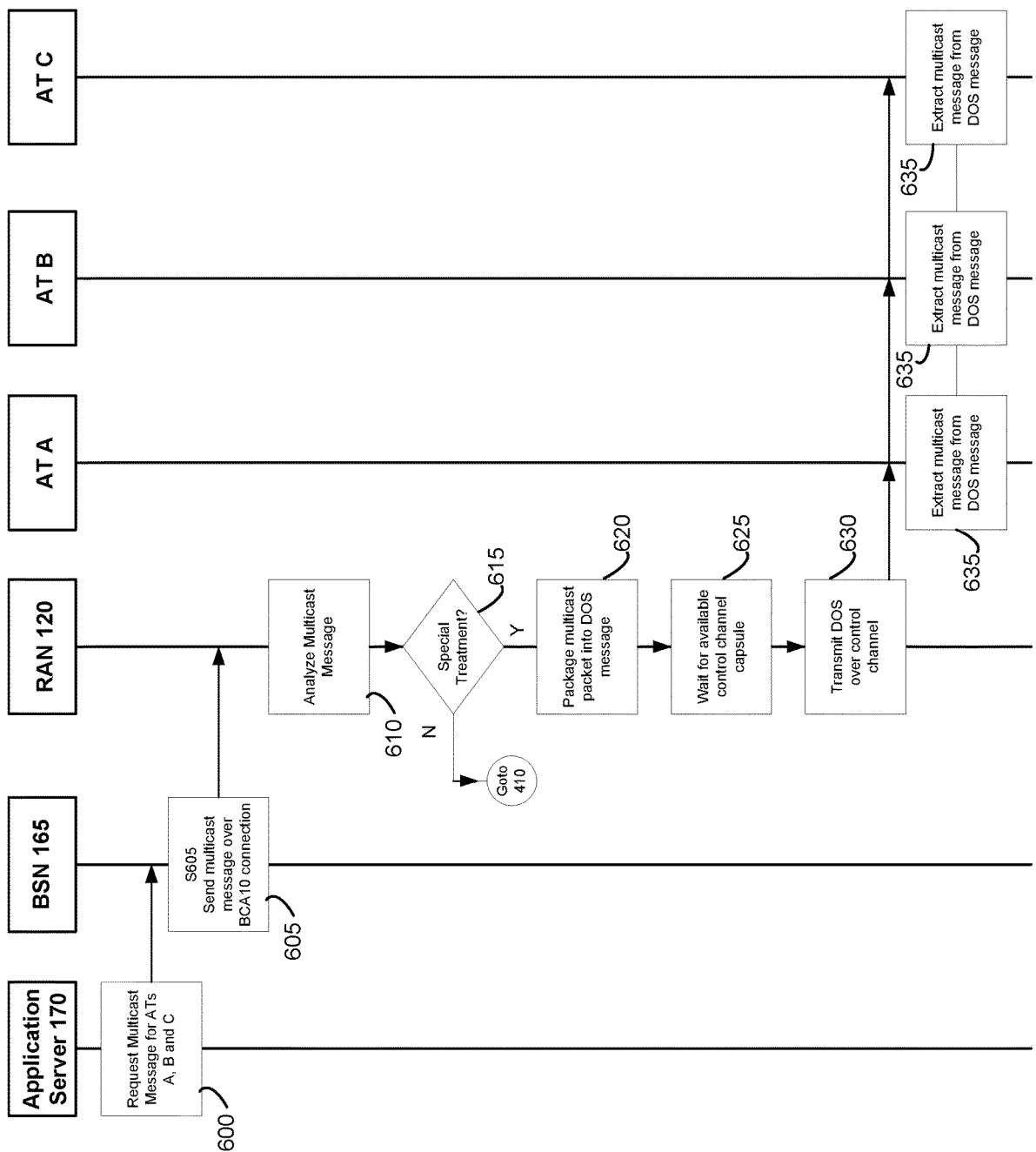

MULTICAST MESSAGING WITHIN A WIRELESS COMMUNICATION SYSTEM

CLAIM OF PRIORITY

The present Application for Patent is a divisional of U.S. patent application Ser. No. 14/026,128, entitled "MULTICAST MESSAGING WITHIN A WIRELESS COMMUNICATION SYSTEM", filed Sep. 13, 2013, which in turn is a divisional of U.S. patent application Ser. No. 12/212,462, entitled "MULTICAST MESSAGING WITHIN A WIRELESS COMMUNICATION SYSTEM", filed Sep. 17, 2008, which in turn claims priority to Provisional Application No. 60/974,833 entitled "MULTICAST MESSAGING WITHIN A WIRELESS COMMUNICATION SYSTEM", filed Sep. 24, 2007, each of which is assigned to the assignee hereof and is hereby expressly incorporated by reference herein in its entirety.

BACKGROUND OF THE INVENTION

1. Field of the Invention

The invention relates to communications in a wireless telecommunication system and, more particularly to multicast messaging within the wireless communication system.

2. Description of the Related Art

Wireless communication systems have developed through various generations, including a first-generation analog wireless phone service (1G), a second-generation (2G) digital wireless phone service (including interim 2.5G and 2.75G networks) and a third-generation (3G) high speed data/Internet-capable wireless service. There are presently many different types of wireless communication systems in use, including Cellular and Personal Communications Service (PCS) systems. Examples of known cellular systems include the cellular Analog Advanced Mobile Phone System (AMPS), and digital cellular systems based on Code Division Multiple Access (CDMA), Frequency Division Multiple Access (FDMA), Time Division Multiple Access (TDMA), the Global System for Mobile access (GSM) variation of TDMA, and newer hybrid digital communication systems using both TDMA and CDMA technologies.

The method for providing CDMA mobile communications was standardized in the United States by the Telecommunications Industry Association/Electronic Industries Association in TIA/EIA/IS-95-A entitled "Mobile Station-Base Station Compatibility Standard for Dual-Mode Wideband Spread Spectrum Cellular System," referred to herein as IS-95. Combined AMPS & CDMA systems are described in TIA/EIA Standard IS-98. Other communications systems are described in the IMT-2000/UM, or International Mobile Telecommunications System 2000/Universal Mobile Telecommunications System, standards covering what are referred to as wideband CDMA (WCDMA), CDMA2000 (such as CDMA2000 1xEV-DO standards, for example) or TD-SCDMA.

In wireless communication systems, mobile stations, handsets, or access terminals (AT) receive signals from fixed position base stations (also referred to as cell sites or cells) that support communication links or service within particular geographic regions adjacent to or surrounding the base stations. Base stations provide entry points to an access network (AN)/radio access network (RAN), which is generally a packet data network using standard Internet Engineering Task Force (IETF) based protocols that support methods for differentiating traffic based on Quality of Service (QoS) requirements. Therefore, the base stations generally interact with ATs through an over the air interface and with the AN through Internet Protocol (IP) network data packets.

In wireless telecommunication systems, Push-to-talk (PTT) capabilities are becoming popular with service sectors and consumers. PTT can support a "dispatch" voice service that operates over standard commercial wireless infrastructures, such as CDMA, FDMA, TDMA, GSM, etc. In a dispatch model, communication between endpoints (ATs) occurs within virtual groups, wherein the voice of one "talker" is transmitted to one or more "listeners." A single instance of this type of communication is commonly referred to as a dispatch call, or simply a PTT call. A PTT call is an instantiation of a group, which defines the characteristics of a call. A group in essence is defined by a member list and associated information, such as group name or group identification.

Conventionally, data packets within a wireless communication network have been configured to be sent to a single destination or access terminal. A transmission of data to a single destination is referred to as "unicast". As mobile communications have increased, the ability to transmit given data concurrently to multiple access terminals has become more important. Accordingly, protocols have been adopted to support concurrent data transmissions of the same packet or message to multiple destinations or target access terminals. A "broadcast" refers to a transmission of data packets to all destinations or access terminals (e.g., within a given cell, served by a given service provider, etc.), while a "multicast" refers to a transmission of data packets to a given group of destinations or access terminals. In an example, the given group of destinations or "multicast group" may include more than one and less than all of possible destinations or access terminals (e.g., within a given group, served by a given service provider, etc.). However, it is at least possible in certain situations that the multicast group comprises only one access terminal, similar to a unicast, or alternatively that the multicast group comprises all access terminals (e.g., within a cell or sector), similar to a broadcast.

Broadcasts and/or multicasts may be performed within wireless communication systems in a number of ways, such as performing a plurality of sequential unicast operations to accommodate the multicast group, allocating a unique broadcast/multicast channel (BCH) for handling multiple data transmissions at the same time and the like. A conventional system using a broadcast channel for push-to-talk communications is described in United States Patent Application Publication No. 2007/0049314 dated Mar. 1, 2007 and entitled "Push-To-Talk Group Call System Using CDMA 1x-EVDO Cellular Network", the contents of which are incorporated herein by reference in its entirety. As described in Publication No. 2007/0049314, a broadcast channel can be used for push-to-talk calls using conventional signaling techniques. Although the use of a broadcast channel may improve bandwidth requirements over conventional unicast techniques, the conventional signaling of the broadcast channel can still result in additional overhead and/or delay and may degrade system performance.

The $3^{rd}$ Generation Partnership Project 2 ("3GPP2") defines a broadcast-multicast service (BCMCS) specification for supporting multicast communications in CDMA2000 networks. Accordingly, a version of 3GPP2's BCMCS specification, entitled "CDMA2000 High Rate Broadcast-Multicast Packet Data Air Interface Specification", dated Feb. 14, 2006, Version 1.0 C.S0054-A, is hereby incorporated by reference in its entirety.

SUMMARY

Embodiments of the invention are directed to methods and systems for sending multicast messages. For example, a method includes receiving a multicast message to be transmitted to a plurality of access terminals at a radio access network (RAN), the received multicast message having a first format. The first format may correspond to a conventional multicast message format. The RAN determines whether the received multicast message requires special handling. If the RAN determines the received multicast message requires special handling, the radio access network converts the received multicast message from the first format into a second format. The RAN transmits the converted multicast message with the second format (e.g., a data over signaling (DOS) message) on a control channel to at least one of the plurality of access terminals. The access terminals receiving the converted multicast message interpret the message as a multicast message.

BRIEF DESCRIPTION OF THE DRAWINGS

A more complete appreciation of embodiments of the invention and many of the attendant advantages thereof will be readily obtained as the same becomes better understood by reference to the following detailed description when considered in connection with the accompanying drawings which are presented solely for illustration and not limitation of the invention, and in which:

FIG. 6 illustrates a multicast messaging process according to an embodiment of the present invention.

DETAILED DESCRIPTION

Figure 1:
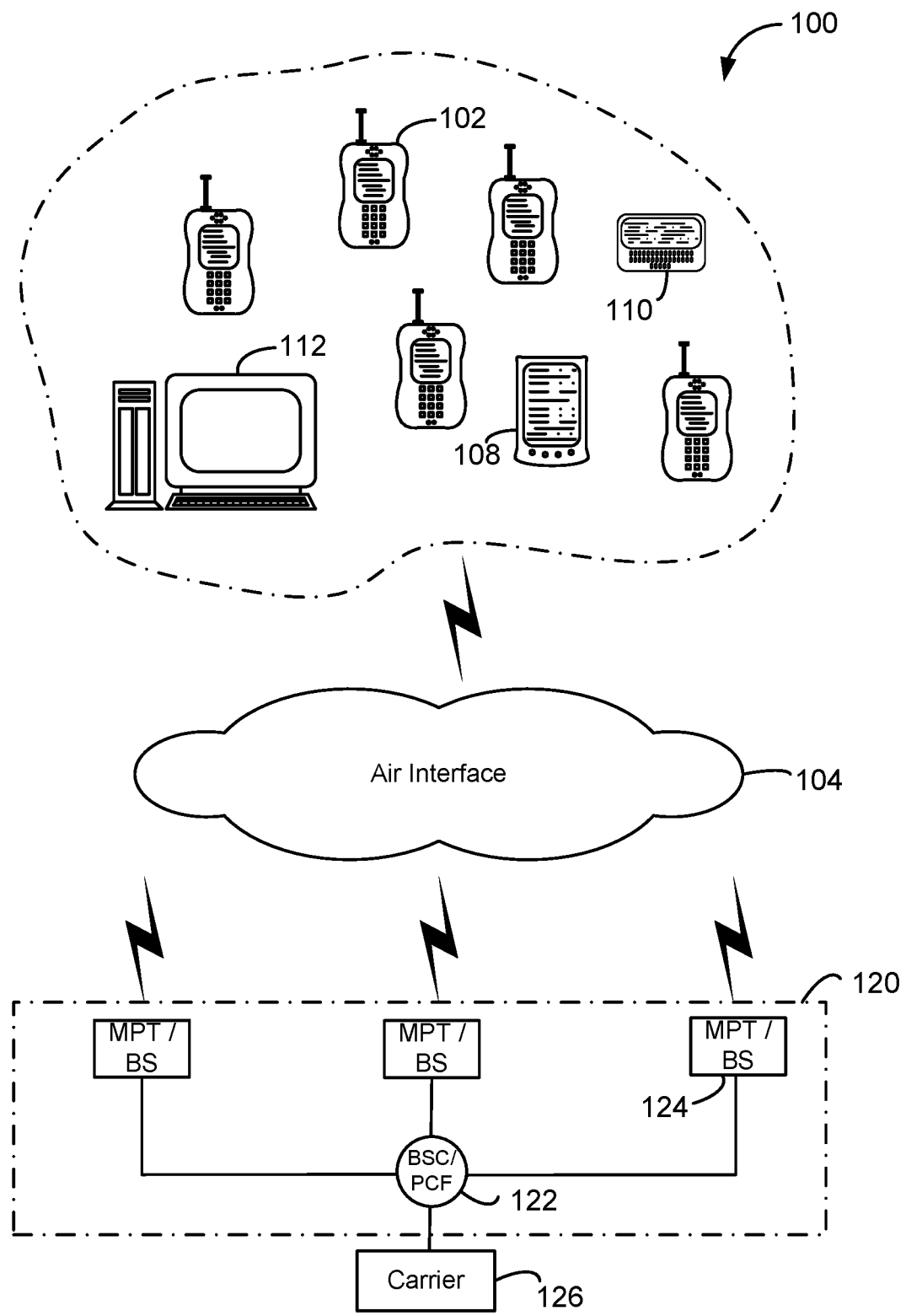
FIG. 1 is a diagram of a wireless network architecture that supports access terminals and access networks in accordance with at least one embodiment of the invention.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The words "exemplary" and/or "example" are used herein to mean "serving as an example, instance, or illustration." Any embodiment described herein as "exemplary" and/or "example" is not necessarily to be construed as preferred or advantageous over other embodiments. Likewise, the term "embodiments of the invention" does not require that all embodiments of the invention include the discussed feature, advantage or mode of operation.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

A High Data Rate (HDR) subscriber station, referred to herein as an access terminal (AT), may be mobile or stationary, and may communicate with one or more HDR base stations, referred to herein as modem pool transceivers (MPTs) or base stations (BS). An access terminal transmits and receives data packets through one or more modem pool transceivers to an HDR base station controller, referred to as a modem pool controller (MPC), base station controller (BSC) and/or packet control function (PCF). Modem pool transceivers and modem pool controllers are parts of a network called an access network. An access network transports data packets between multiple access terminals.

The access network may be further connected to additional networks outside the access network, such as a corporate intranet or the Internet, and may transport data packets between each access terminal and such outside networks. An access terminal that has established an active traffic channel connection with one or more modem pool transceivers is called an active access terminal, and is said to be in a traffic state. An access terminal that is in the process of establishing an active traffic channel connection with one or more modem pool transceivers is said to be in a connection setup state. An access terminal may be any data device that communicates through a wireless channel or through a wired channel, for example using fiber optic or coaxial cables. An access terminal may further be any of a number of types of devices including but not limited to PC card, compact flash, external or internal modem, or wireless or wireline phone. The communication link through which the access terminal sends signals to the modem pool transceiver is called a reverse link or traffic channel. The communication link through which a modem pool transceiver sends signals to an access terminal is called a forward link or traffic channel. As used herein the term traffic channel can refer to either a forward or reverse traffic channel.

FIG. 1 illustrates a block diagram of one exemplary embodiment of a wireless system 100 in accordance with at least one embodiment of the invention. System 100 can contain access terminals, such as cellular telephone 102, in communication across an air interface 104 with an access network or radio access network (RAN) 120 that can connect the access terminal 102 to network equipment providing data connectivity between a packet switched data network (e.g., an intranet, the Internet, and/or carrier network 126) and the access terminals 102, 108, 110, 112. As shown here, the access terminal can be a cellular telephone 102, a personal digital assistant 108, a pager 110, which is shown here as a two-way text pager, or even a separate computer platform 112 that has a wireless communication portal. Embodiments of the invention can thus be realized on any form of access terminal including a wireless communication portal or having wireless communication capabilities, including without limitation, wireless modems, PCMCIA cards, personal computers, telephones, or any combination or sub-combination thereof. Further, as used herein, the terms "access terminal", "wireless device", "client device", "mobile terminal" and variations thereof may be used interchangeably.

Referring back to FIG. 1, the components of the wireless network 100 and interrelation of the elements of the exemplary embodiments of the invention are not limited to the configuration illustrated. System 100 is merely exemplary and can include any system that allows remote access terminals, such as wireless client computing devices 102, 108, 110, 112 to communicate over-the-air between and among each other and/or between and among components connected via the air interface 104 and RAN 120, including, without limitation, carrier network 126, the Internet, and/or other remote servers.

The RAN 120 controls messages (typically sent as data packets) sent to a base station controller/packet control function (BSC/PCF) 122. The BSC/PCF 122 is responsible for signaling, establishing, and tearing down bearer channels (i.e., data channels) between a packet data service node 100 ("PDSN") and the access terminals 102/108/110/112. If link layer encryption is enabled, the BSC/PCF 122 also encrypts the content before forwarding it over the air interface 104. The function of the BSC/PCF 122 is well-known in the art and will not be discussed further for the sake of brevity. The carrier network 126 may communicate with the BSC/PCF 122 by a network, the Internet and/or a public switched telephone network (PSTN). Alternatively, the BSC/PCF 122 may connect directly to the Internet or external network. Typically, the network or Internet connection between the carrier network 126 and the BSC/PCF 122 transfers data, and the PSTN transfers voice information. The BSC/PCF 122 can be connected to multiple base stations (BS) or modem pool transceivers (MPT) 124. In a similar manner to the carrier network, the BSC/PCF 122 is typically connected to the MPT/BS 124 by a network, the Internet and/or PSTN for data transfer and/or voice information. The MPT/BS 124 can broadcast data messages wirelessly to the access terminals, such as cellular telephone 102. The MPT/BS 124, BSC/PCF 122 and other components may form the RAN 120, as is known in the art. However, alternate configurations may also be used and the invention is not limited to the configuration illustrated. For example, in another embodiment the functionality of the BSC/PCF 122 and one or more of the MPT/BS 124 may be collapsed into a single "hybrid" module having the functionality of both the BSC/PCF 122 and the MPT/BS 124.

Figure 2:
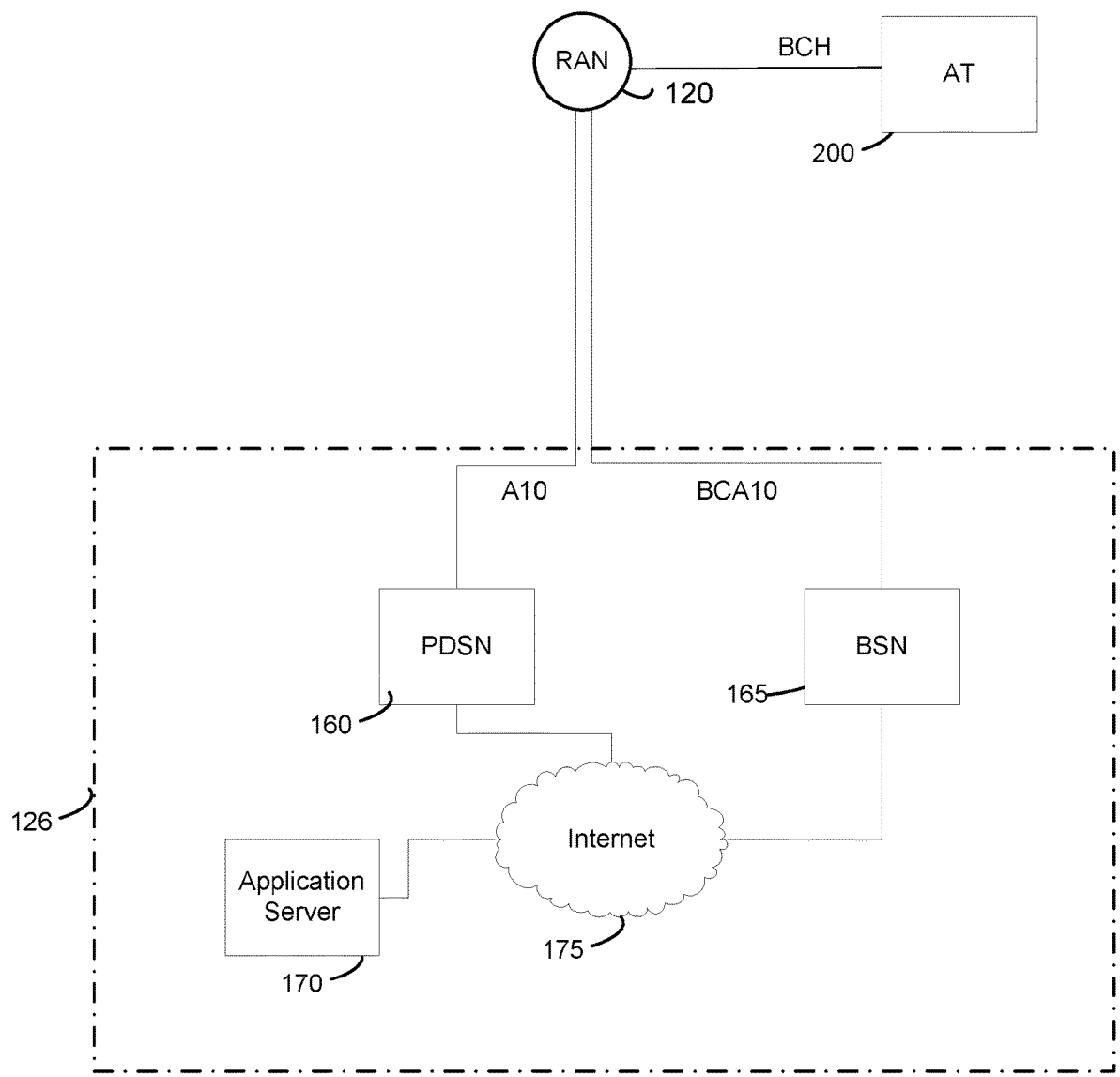
FIG. 2 illustrates the carrier network according to an embodiment of the present invention.

FIG. 2 illustrates the carrier network 126 according to an embodiment of the present invention. In the embodiment of FIG. 2, the carrier network 126 includes a packet data serving node (PDSN) 160, a broadcast serving node (BSN) 165, an application server 170 and an Internet 175. However, application server 170 and other components may be located outside the carrier network in alternative embodiments. The PDSN 160 provides access to the Internet 175, intranets and/or remote servers (e.g., application server 170) for mobile stations (e.g., access terminals, such as 102, 108, 110, 112 from FIG. 1) utilizing, for example, a cdma2000 Radio Access Network (RAN) (e.g., RAN 120 of FIG. 1). Acting as an access gateway, the PDSN 160 may provide simple IP and mobile IP access, foreign agent support, and packet transport. The PDSN 160 can act as a client for Authentication, Authorization, and Accounting (AAA) servers and other supporting infrastructure and provides mobile stations with a gateway to the IP network as is known in the art. As shown in FIG. 2, the PDSN 160 may communicate with the RAN 120 (e.g., the BSC/PCF 122) via a conventional A10 connection. The A10 connection is well-known in the art and will not be described further for the sake of brevity.

Referring to FIG. 2, the broadcast serving node (BSN) 165 is typically configured to support multicast and broadcast services. The BSN 165 will be described in greater detail below. The BSN 165 communicates with the RAN 120 (e.g., the BSC/PCF 122) via a broadcast (BC) A10 connection, and with the application server 170 via the Internet 175. The BCA10 connection is used to transfer multicast and/or broadcast messaging. Accordingly, the application server 170 sends unicast messaging to the PDSN 160 via the Internet 175, and sends multicast messaging to the BSN 165 via the Internet 175. The PDSN and BSN may be integrated into a single network node.

Generally, as will be described in greater detail below, the RAN 120 transmits multicast messages, received from the BSN 165 via the BCA10 connection, over a broadcast channel (BCH) of the air interface 104 to one or more access terminals 200.

Figure 3:
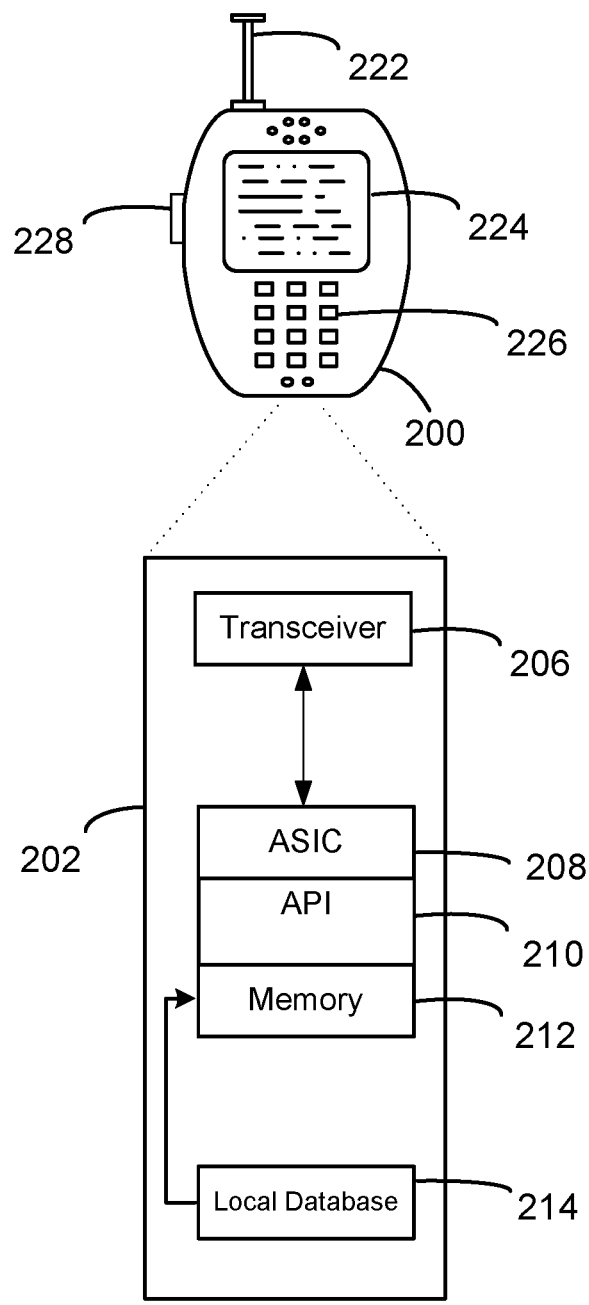
FIG. 3 is an illustration of an access terminal in accordance with at least one embodiment of the invention.

Referring to FIG. 3, an access terminal 200, (here a wireless device), such as a cellular telephone, has a platform 202 that can receive and execute software applications, data and/or commands transmitted from the RAN 120 that may ultimately come from the carrier network 126, the Internet and/or other remote servers and networks. The platform 202 can include a transceiver 206 operably coupled to an application specific integrated circuit ("ASIC" 208), or other processor, microprocessor, logic circuit, or other data processing device. The ASIC 208 or other processor executes the application programming interface ("API') 210 layer that interfaces with any resident programs in the memory 212 of the wireless device. The memory 212 can be comprised of read-only or random-access memory (RAM and ROM), EEPROM, flash cards, or any memory common to computer platforms. The platform 202 also can include a local database 214 that can hold applications not actively used in memory 212. The local database 214 is typically a flash memory cell, but can be any secondary storage device as known in the art, such as magnetic media, EEPROM, optical media, tape, soft or hard disk, or the like. The internal platform 202 components can also be operably coupled to external devices such as antenna 222, display 224, push-to-talk button 228 and keypad 226 among other components, as is known in the art.

Accordingly, an embodiment of the invention can include an access terminal including the ability to perform the functions described herein. As will be appreciated by those skilled in the art, the various logic elements can be embodied in discrete elements, software modules executed on a processor or any combination of software and hardware to achieve the functionality disclosed herein. For example, ASIC 208, memory 212, API 210 and local database 214 may all be used cooperatively to load, store and execute the various functions disclosed herein and thus the logic to perform these functions may be distributed over various elements. Alternatively, the functionality could be incorporated into one discrete component. Therefore, the features of the access terminal in FIG. 3 are to be considered merely illustrative and the invention is not limited to the illustrated features or arrangement.

The wireless communication between the access terminal 102 and the RAN 120 can be based on different technologies, such as code division multiple access (CDMA), WCDMA, time division multiple access (TDMA), frequency division multiple access (FDMA), Orthogonal Frequency Division Multiplexing (OFDM), the Global System for Mobile Communications (GSM), or other protocols that may be used in a wireless communications network or a data communications network. The data communication is typically between the client device 102, MPT/BS 124, and BSC/PCF 122. The BSC/PCF 122 can be connected to multiple data networks such as the carrier network 126, PSTN, the Internet, a virtual private network, and the like, thus allowing the access terminal 102 access to a broader communication network. As discussed in the foregoing and known in the art, voice transmission and/or data can be transmitted to the access terminals from the RAN using a variety of networks and configurations. Accordingly, the illustrations provided herein are not intended to limit the embodiments of the invention and are merely to aid in the description of aspects of embodiments of the invention.

As discussed in the Background section, multicast messaging may be performed in a number of ways. In order to better understand embodiments of the present invention, a conventional multicast messaging process will be described with respect to FIGS. 4 and 5, respectively. Then, a multicast messaging process according to an embodiment of the present invention will be described in greater detail.

Figure 4:
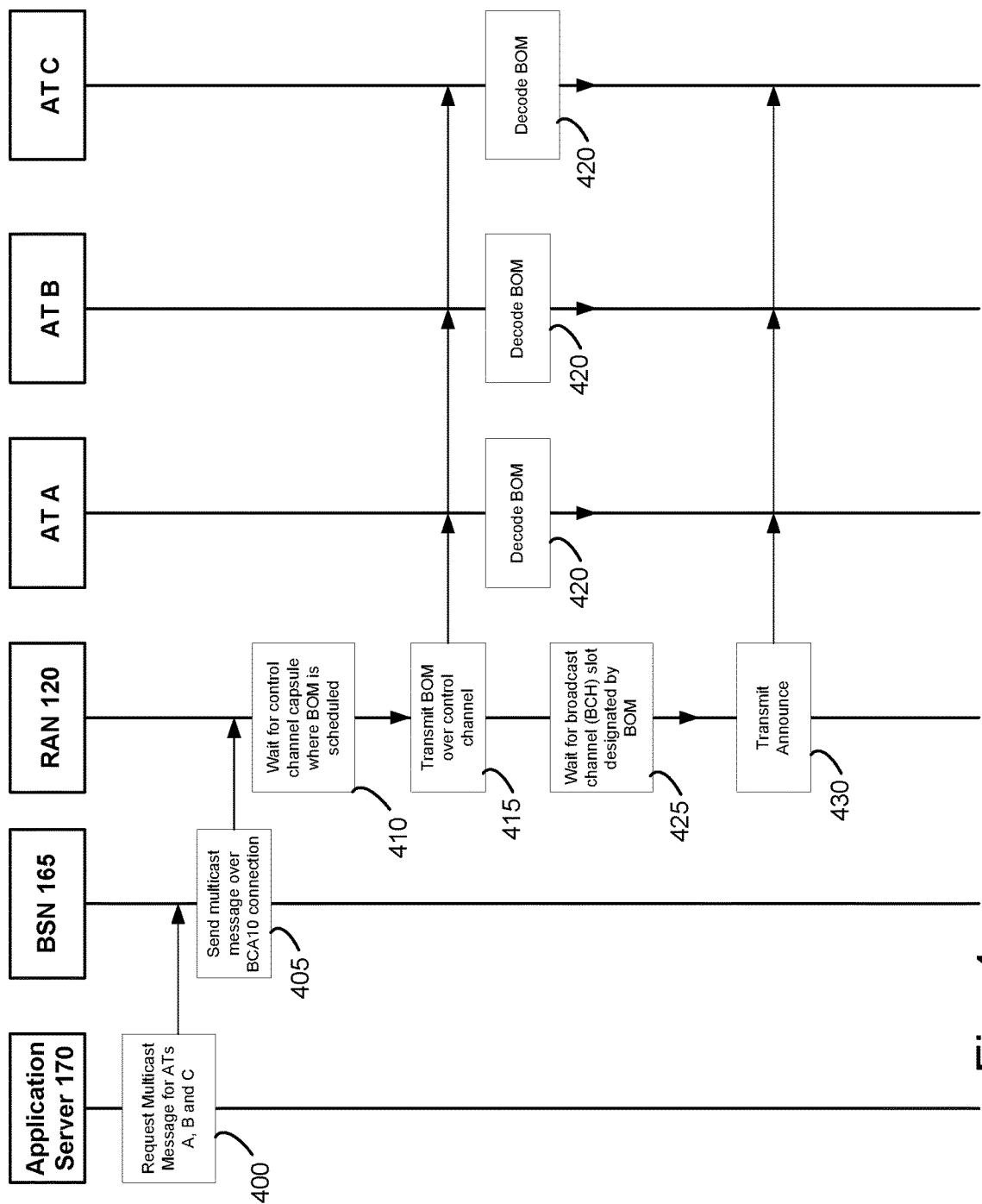
FIG. 4 illustrates a conventional multicast messaging process using a broadcast multicast server (BCMCS) framework.

FIG. 4 illustrates a conventional multicast messaging process using a broadcast multicast server (BCMCS) framework. The multicast messaging process of FIG. 4 is described below as performed within the wireless system 100 of FIGS. 1 and 2. Referring to FIG. 4, in 400, the application server (or other initiator) requests a multicast message be sent to a multicast group including ATs (e.g., A, B and C). The multicast message from 400 is routed to the BSN 165. In 405, the BSN 165 forwards the multicast message along with the associated multicast group including the target destinations or ATs for the multicast message over the BCA10 connection to the RAN 120. For example, the multicast message is first forwarded to the BSC/PCF 122, and the BSN/PCF 122 analyzes the multicast group members for the multicast message and forwards the multicast message to each MPT/BS 124 serving one or more multicast group members.

After receiving the forwarded multicast message, the RAN 120 waits for a next available control channel capsule in 410. The control channel referred to herein is a downlink control channel which is assigned a different frequency, coding and/or bandwidth than the broadcast channel (BCH). Generally, less bandwidth is allocated to the control channel, which is conventionally intended to include control messaging only, while more bandwidth is allocated to the broadcast channel (BCH) which is conventionally intended to include data.

Figure 5:
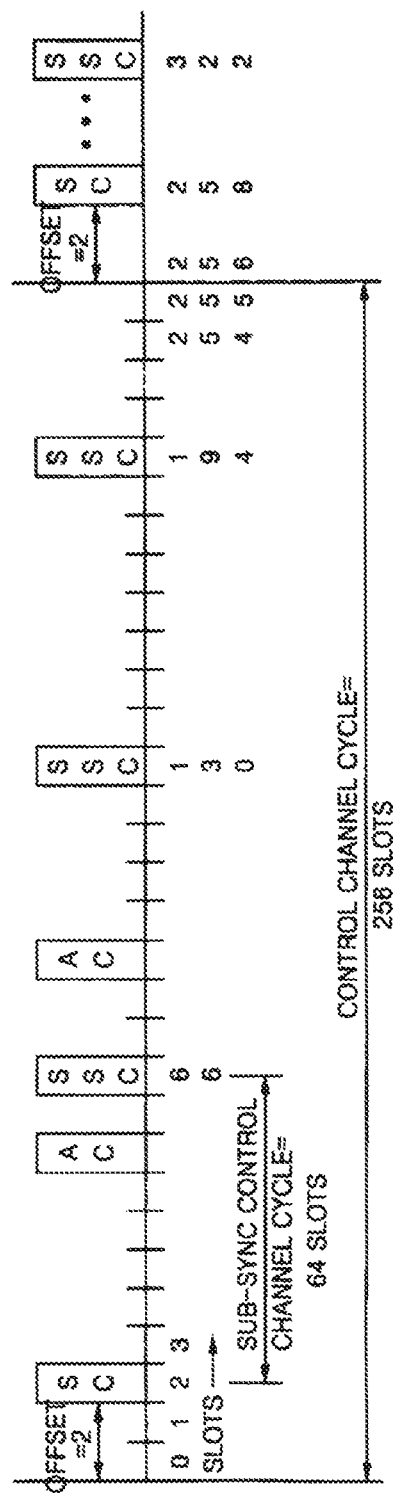
FIG. 5 illustrates a cycle of a downlink control channel.

Referring to FIG. 5, each control channel cycle includes a total of 256 slots. Each control channel cycle includes a synchronous control channel capsule (SC), an asynchronous control channel capsule (AC), and a number of sub-synchronous control channels (SSCs). One SC is regularly or periodically transmitted at a given timeslot for each control channel cycle having a period of 256 slots, whereas the AC is transmitted at "random", or at non-synchronous timeslots, within the control channel cycle. The SC is first transmitted at a timeslot corresponding to "T mod 256=Offset", and then retransmitted at a timeslot corresponding to "T mod 4=Offset", where T denotes a system time and an Offset denotes a time value delayed from a fixed time, which are included in the control channel header. Each SC may include a plurality of control channel MAC layer packets, whereas each AC includes only one control channel MAC layer packet. As each MPT/BS 124 periodically transmits one or more control channel MAC layer packets, interference (e.g., inter-cell interference) may occur if each MPT/BS 124 transmits at the same time. Accordingly, a different offset is applied to the SC for each MPT/BS 124 to avoid collisions. The MPT/BS may transmit as many as three SSC capsules within one control channel period or 256 slot cycle. Each SSC typically transmits only one control channel MAC layer packet. Assuming an offset value of 2, the SSCs are transmitted at time slots 66, 130 and 194. Control channel capsules (e.g., SCs, ACs, SSCs, etc.) are generally well-known in the art within BCMCS systems, and as such a further description thereof has been omitted for the sake of brevity.

Returning back to FIG. 4, in 410, the RAN 120 may wait for either a synchronous control channel capsule (SC) (e.g., timeslot 2 in a next control channel cycle assuming an offset of 2) or, alternatively, a sub-synchronous control channel capsule (SSC) (e.g., one of timeslots 66, 130, 194 of the control channel cycle assuming an offset of 2), where the periodic BOM message is scheduled. For example, one particular control channel capsule within each control channel cycle may be reserved for a particular BOM. Since other applications may be attempting to access the control channel and other messages may be scheduled a delay of multiple cycles may be incurred.

In 415, after waiting for the next available SC or SSC, the RAN 120 transmits a broadcast overhead message (BOM) over the air interface to one or more multicast group members (e.g., ATs A, B, C). The BOM is a forward link control message defined by EV-DO standards. The BOM is used to notify each multicast group member of the BCMCS flows which are currently being carried in a sector. The BOM also provides Interlaced Multiplexed Pair (IM-Pair) information which is information regarding the forward link physical layer timeslots that should be decoded to receive the desired packet flows, and information on the number of physical layer slots per broadcast physical layer packet and physical layer rate used to transmit the flow. In 420, the RAN 120 waits a predetermined number of slots (e.g., 8 to 16 slots) for the BOM to be decoded at the target ATs. After the delay 420, the RAN 120 waits for the BCH slot designated by the decoded BOM, 425. This creates another delay, which may be further exacerbated based on the traffic on the broadcast channel. In 430, the RAN 120 transmits the announce message to each multicast group member or target AT which it is serving over the broadcast channel (BCH) on the designated BCH slot.

As described above with respect to FIG. 4, conventional BCMCS multicast messaging typically requires each target AT or multicast group member to decode a broadcast overhead message (BOM) before a multicast message is transmitted over a broadcast channel (BCH) to the respective members of the multicast group. This creates delays both for the scheduling of the BOM, delays for the decoding, and potential subsequent delays for the scheduling the announce message.

In the embodiment of FIG. 6, in 600, the application server 170 requests a multicast message be sent to a multicast group including ATs A, B and C. The multicast message from 600 is routed to the BSN 165. In 605, the BSN 165 forwards the multicast message along with the associated multicast group including the target destinations or ATs for the multicast message over the BCA10 connection to the RAN 120. For example, the BSN 165 may forward the multicast message to the BSC/PCF 122, which may analyze the multicast group members associated with the multicast message and forwards the multicast message to each MPT/BS 124 serving one or more multicast group members.

After receiving the forwarded multicast messages, the RAN 120 analyzes the received multicast message in 610. Based on the analysis in 610, the RAN 120 determines whether to apply special handling instructions or treatment to the multicast message in 615. For example, the analyzing in 610 may evaluate the internet protocol (IP) header of the multicast message. If a "flag" is determined to be present within the IP header, for example, the Difserv Code Point (DSCP) value of the IP header, the flag may be interpreted as a trigger which requests special handling for the multicast message. Alternatively, the flag may be provided within the well-known BCA10 identifier (ID) or BCMCS flow ID (e.g., separate from the IP header). For example, before the multicast session, the BSN 165 may be configured with the multicast sessions, each identified by a multicast IP address and port number, which are "reserved" or associated with special handling (e.g., multicast sessions reserved for emergency communications, etc.). The BSN 165 may then share the corresponding BCMCS flow IDs with the RAN 120. Accordingly, thereafter, during a multicast session, the RAN 120 may check, in 610, whether the received multicast message corresponds to one of the reserved BCMCS flow IDs, and if so, determines to apply special handling for the received multicast message in 615.

In another alternative example, the flag may be provided via both the IP header and BCMCS flow ID/BCA10 ID. Generally, a flag represented by a BCMCS flow ID may be recognized by either portion of the BSC/PCF 122 whereas a flag within the IP header (either a DSCP or a multicast IP address and port number) may be recognized/decoded by the PCF portion of the BSC/PCF 12 of the RAN 120. BCA10 identifiers and DSCP values are well-known in the art, and will not be described further for the sake of brevity.

For example, the "flag" may be inserted into the multicast message (e.g., via the IP header, the BCMCS flow ID or BCA10 ID, etc.) at any higher-level position within the network architecture relative to the RAN 120. The flag may be inserted into the IP header by the application server 170, the BSN 165, etc. In another example, the flag may be used to designate "higher priority" multicast messages, such as announce messages that announce or initiate a particular PTT session. In another example, multicast messages associated with emergency alerts may be "flagged", whereas multicast messages associated with product advertisements may not necessarily be "flagged".

In 615, if the RAN 120 determines not to apply special handling to the multicast message, the process advances to block 410 of FIG. 4 and conventional BCMCS multicast message protocols can be used to transmit the multicast message to the multicast message group. Otherwise, if the RAN 120 determines that special handling has been requested for the multicast message in 615, the process advances to 620.

In 620, the RAN 120 generates a data over signaling (DOS) message which includes the multicast message. DOS messages are well-known in the art within EV-DO protocols. DOS messages are defined by EV-DO standards as a unicast message, and are not associated with multicast messaging in the EV-DO standard. However, embodiments of the invention generate a DOS message including the multicast message. The DOS message may be reconfigured to support multicast messaging protocols, as will now be described.

The CDMA2000 1× EV-DO defines, an access terminal identifier (ATI) for identifying an access terminal, a broadcast ATI (BATI), a multicast ATI (MATI), a unicast ATI (UATI), and a random ATI (RATI). The BATI is defined as "00", the MATI is defined as "01", the UATI is defined as "10", and the RATI is defined as "11". The three ATI types excluding the BATI have a 32-bit field for representing an ATI. The UATI is used in a 1:1 call processing procedure.

As discussed above, DOS messages are defined by EV-DO standards as being associated with unicast messaging, and not multicast messaging. However, the DOS message generated in 620 is addressed to the multicast access terminal identifier (MATI), where the MATI is set to the BCMCS-FlowID associated with the multicast message. The BCMCSFlowID allows the ATs to identify the appropriate stream on the broadcast channel for the group call. Generally, the BCMCSFlowID is known at each respective AT which is monitoring a particular BCMCS flow (e.g., the BCMCSFlowID may be designated by the BOM, etc.). Accordingly, as will be described in greater detail below, by tagging or addressing the DOS message of 620 to the MATI, the target ATs receiving the DOS message may interpret the DOS message as a multicast message associated with a particular BCMCS flow, and directly receive the needed information to start the group call. Alternatively, however, it will be appreciated that other embodiments need not be limited to setting the MATI to the BCMCSFlowID to distinguish the DOS as a multicast message. For example, the MATI may be set to any value which multicast group members or ATs may interpret as identifying the MATI to be a multicast message for a particular multicast group.

In 625, the RAN 120 waits for a next available control channel capsule on the control channel. In 630, the RAN 120 transmits the DOS message to the multicast group members over the control channel within the next available control channel capsule. As discussed above, each synchronous channel (SC) (e.g., or alternatively, each sub-synchronous channel) of the control channel capsule may include a plurality of MAC layer packets. Accordingly, in an example, the DOS message may be included in the first MAC layer packet of the given control channel capsule.

In 635, each target AT receives the DOS message transmitted in 630 over the control channel Because the DOS message is addressed to the MATI, each target AT determines the DOS message to include the associated multicast message (e.g., as opposed to a unicast message). It will be appreciated that a DOS message addressed to a MATI would likely be interpreted as an error in a conventional handset or AT. In this embodiment, however, each target AT may be configured to recognize a control message addressed to the MATI (e.g., or otherwise identified as a multicast message) as a multicast message, such that the AT configured in accordance with this embodiment extracts the multicast message from the received DOS message in 635. The respective target ATs may acknowledge receipt of the multicast message included within the DOS message subsequent to a successful receipt or "extracting" of the multicast message. In another aspect of the invention, the RAN 120 may first confirm that one or more given target ATs is capable of interpreting, for example, DOS messages using the MATI as multicast messages, in order to ensure that the DOS multicast messages are interpreted correctly by receiving ATs. In an example, each AT receiving the DOS message may decode/extract the multicast message in 635, irrespective of whether the AT is actually one of the intended recipients of the multicast message. In another example, only "target" ATs, or ATs interested in the multicast session, may decode/extract the multicast message from the DOS message in 635.

As will be appreciated from the forgoing description of the exemplary multicast messaging process of FIG. 6, the delays and potential loss of data associated with sending a BOM to the multicast group members, waiting for BOM decoding, and sending an announce message, may be avoided for DOS multicast messages by allocating higher-priority status via an IP header flag and transmitting the higher-priority multicast messages via the control channel.

Further, it will be appreciated that the process of FIG. 6, which has been described as being performed at the RAN 120 and/or MPT/BS 124 may be performed at one or more RANs and/or MPT/BSs at the same time in other embodiments of the invention, and the description of FIG. 6 has been directed to a single-RAN and MPT/BS implementation for the sake of convenience of description only. In another example, if multicast group members are dispersed among different MPT/BS 124's, procedures 610 through 635 may be performed among the different MPT/BS 124's independently.

Further, while the embodiment of FIG. 6 is directed to a DOS message in 1×EVDO being set to a MATI address or multicast bit signature as opposed to a UATI address or unicast bit signature, it will be appreciated that any control channel message adapted to conform to a MATI-type message may alternatively be used to transfer a multicast message on the control channel.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Accordingly an embodiment of the invention can include an apparatus including logic configured to detect a multicast message associated with special handling instructions or higher priority status (e.g., via an IP header flag). The apparatus can further include logic configured to package the higher priority multicast message into a DOS message, logic configured to transmit the DOS message to ATs belonging to the multicast group members for the multicast message at a next available SC or SSC. The various logical elements can be integrated into one device or can be distributed over several devices each operably couple to one another. For example, the apparatus can be a radio access network, a group communication system, or a wireless communication network.

Further, aspects of embodiments of the invention can include logical implementations of the functions described herein. For example, embodiments of the invention can further include logic configured to detect a multicast message associated with special handling instructions or higher priority status (e.g., via an IP header flag). The logic can further be configured to package the higher priority multicast message into a DOS message, logic configured to transmit the DOS message to ATs belonging to the multicast group members for the multicast message at a next available SC or SSC. Accordingly, those skilled in the art will appreciate that embodiments of the invention are not limited to the examples provided herein.

The methods, sequences and/or algorithms described in connection with the embodiments disclosed herein may be embodied directly in hardware, in a software module executed by a processor, or in a combination of the two. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Accordingly, an embodiment of the invention can include a computer-readable medium including code stored thereon for detecting a multicast message associated with special handling instructions or higher priority status (e.g., via an IP header flag). The code can further package the higher priority multicast message into a DOS message, and transmit the DOS message to ATs belonging to the multicast group members for the multicast message at a next available SC or SSC. Further, any of the functions describe herein can be included in as additional code in further embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of receiving multicast messages within a wireless communication system, comprising:
   at an access terminal:
   receiving, on a control channel for indicating timeslots that should be decoded to receive a multicast transmission on a second channel, instead of on the second channel, a first message in a first message format, the first message containing a multicast message and being associated with a first identifier,
   wherein the first message is transported over the control channel instead of over the second channel based on the first identifier associated with the multicast message being among a first subset of available identifiers instead of a second subset of the available identifiers that is different than the first subset of the available identifiers, irrespective of message type, and
   wherein each of the available identifiers is configured to target more than one and less than all access terminals in the wireless communication system;
   determining that the first message includes the multicast message;
   extracting the multicast message from the first message based on the determining; and
   receiving a second message in a second message format on the second channel.

2. The method of claim 1, wherein the first message is a data over signaling (DOS) message.

3. The method of claim 2, wherein the multicast message includes a multicast access terminal identifier (MATI) that is set to the first identifier.

4. The method of claim 1, wherein the control channel comprises a synchronous control channel capsule (SC) or a sub-synchronous control channel capsule (SSC).

5. The method of claim 1, wherein the control channel comprises a synchronous control channel capsule (SC) or a sub-synchronous control channel capsule (SSC).

6. The method of claim 1, wherein the multicast message is targeted to a particular multicast communication group.

7. The method of claim 6, wherein the second message is also targeted to the particular multicast communication group.

8. The method of claim 7, the first message is received while a multicast session associated with the particular multicast communication group is inactive.

9. The method of claim 8, wherein the multicast message is configured to announce the multicast session to the particular multicast communication group.

10. The method of claim 1, wherein the first message format is a unicast message format and the second message format is a broadcast or multicast message format.

11. The method of claim 1, wherein the extracting extracts the multicast message irrespective of whether the access terminal is an intended recipient of the multicast message.

12. The method of claim 1, wherein the second channel comprises a broadcast channel or wherein the identifier comprises a multicast flow identifier.

13. An access terminal, comprising:
   at least one transceiver configured to receive, on a control channel for indicating timeslots that should be decoded to receive a multicast transmission on a second channel, instead of on the second channel, a first message in a first message format, the first message containing a multicast message and being associated with a first identifier,
   wherein the first message is transported over the control channel instead of over the second channel based on the first identifier associated with the multicast message being among a first subset of available identifiers instead of a second subset of the available identifiers that is different than the first subset of the available identifiers, irrespective of message type, and
   wherein each of the available identifiers is configured to target more than one and less than all access terminals in a wireless communication system; and
   at least one processor configured to determine that the first message includes the multicast message, and to extract the multicast message from the first message based on the determination,
   wherein the at least one transceiver is further configured to receive a second message in a second message format on the second channel.

14. The access terminal of claim 13, wherein the control channel comprises a synchronous control channel capsule (SC) or a sub-synchronous control channel capsule (SSC).

15. The access terminal of claim 13, wherein the multicast message is targeted to a particular multicast communication group.

16. The access terminal of claim 15, wherein the second message is also targeted to the particular multicast communication group.

17. The access terminal of claim 16, wherein the first message is received while a multicast session associated with the particular multicast communication group is inactive.

18. The access terminal of claim 17, wherein the multicast message is configured to announce the multicast session to the particular multicast communication group.

19. The access terminal of claim 13, wherein the first message format is a unicast message format and the second message format is a broadcast or multicast message format.

20. The method of claim 13, wherein the second channel comprises a broadcast channel or wherein the identifier comprises a multicast flow identifier.

21. A method of transmitting multicast messages within a wireless communication system, comprising:
   at a base station:
   transmitting, to at least one group of access terminals and on a control channel for indicating timeslots that should be decoded to receive a multicast transmission on a second channel, instead of on the second channel, a first message in a first message format, the first message containing a multicast message and being associated with a first identifier,
   wherein the first message is transported over the control channel instead of over the second channel based on the first identifier associated with the multicast message being among a first subset of available identifiers instead of a second subset of the available identifiers that is different than the first subset of the available identifiers, irrespective of message type, and wherein each of the available identifiers is configured to target more than one and less than all access terminals in the wireless communication system; and transmitting, to the at least one group of access terminals, a second message in a second message format on the second channel.

22. The method of claim 21, wherein the control channel comprises a synchronous control channel capsule (SC) or a sub-synchronous control channel capsule (SSC).

23. The method of claim 21, wherein the multicast message is targeted to a particular multicast communication group.

24. The method of claim 23, wherein the second message is also targeted to the particular multicast communication group.

25. The method of claim 24, the first message is transmitted while a multicast session associated with the particular multicast communication group is inactive.

26. The method of claim 25, wherein the multicast message is configured to announce the multicast session to the particular multicast communication group.

27. The method of claim 21, wherein the first message format is a unicast message format and the second message format is a broadcast or multicast message format.

28. The method of claim 21, wherein the second channel comprises a broadcast channel or wherein the identifier comprises a multicast flow identifier.

29. A base station, comprising:
at least one transceiver configured to:
transmit, to at least one group of access terminals and on a control channel for indicating timeslots that should be decoded to receive a multicast transmission on a second channel, instead of on the second channel, a first message in a first message format, the first message containing a multicast message and being associated with a first identifier, wherein the first message is transported over the control channel instead of over the second channel based on the first identifier associated with the multicast message being among a first subset of available identifiers instead of a second subset of the available identifiers that is different than the first subset of the available identifiers, irrespective of message type, and wherein each of the available identifiers is configured to target more than one and less than all access terminals in a wireless communication system, and transmit, to the at least one group of access terminals, a second message in a second message format on the second channel.

30. The base station of claim 29, wherein the control channel comprises a synchronous control channel capsule (SC) or a sub-synchronous control channel capsule (SSC).

31. The base station of claim 29, wherein the multicast message is targeted to a particular multicast communication group.

32. The base station of claim 31, wherein the second message is also targeted to the particular multicast communication group.

33. The base station of claim 32, the first messages is transmitted while a multicast session associated with the particular multicast communication group is inactive.

34. The base station of claim 29, wherein the first message format is a unicast message format and the second message format is a broadcast or multicast message format.

35. The method of claim 29, wherein the second channel comprises a broadcast channel or wherein the identifier comprises a multicast flow identifier.

* * * * *